United States Patent [19]

Gallop et al.

[11] 4,225,818
[45] Sep. 30, 1980

[54] CRYOGENIC NUCLEAR GYROSCOPE

[75] Inventors: John C. Gallop, Twickenham; Susan P. Potts, Letchworth, both of England

[73] Assignee: National Research Development Corporation, London, England

[21] Appl. No.: 958,494

[22] Filed: Nov. 7, 1978

[30] Foreign Application Priority Data

Nov. 10, 1977 [GB] United Kingdom ............... 46866/77

[51] Int. Cl.³ .......................................... G01R 33/08
[52] U.S. Cl. .................................................... 324/302
[58] Field of Search ................ 324/300, 301, 302, 315

[56] References Cited

PUBLICATIONS

L. A. Noberly et al., Application of Squid Magnetometer to Nuclear Magnetic Thermometry, IEEE Transactions on Magnetics, vol. MAG-13, No. 1, Jan. 1977, pp. 358-360.

P. Hensel and D. T. Smith, A Pulsed Nuclear Magnetic Resonance Thermometer for use Below 100 mK, Cryogenics, Mar. 1974, vol. 14, No. 3, pp. 121-131.

Primary Examiner—Michael J. Tokar
Attorney, Agent, or Firm—Cushman, Darby & Cushman

[57] ABSTRACT

A cryogenic nuclear gyroscope comprises a cylinder of niobium cooled within a helium cryostat so as to be superconducting and to provide a trapped, substantially homogeneous magnetic field, a helium-3 sample contained within a spherical pyrex cell having nuclei possessing a net magnetic moment, coils provided to polarize the sample to provide that net magnetic moment, a SQUID magnetometer coupled to the sample by a pick-up coil of a transformer and frequency sensitive means coupled to the SQUID to detect changes in the precession of the nuclear moments of the sample caused by rotation of the gyroscope about an axis parallel to the direction of the homogeneous magnetic field. A superconducting lead shield isolates the helium-3 sample from external magnetic fields.

35 Claims, 3 Drawing Figures

CRYOGENIC NUCLEAR GYROSCOPE

This invention relates to nuclear gyroscopes employing nuclear magnetic resonance and more particularly to a cyrogenic nuclear gyroscope operated in the temperature region of liquid helium for detecting angular displacements.

Conventional gyroscopes used for example in the field of inertial navigation employ gimbal bearings. Friction in the gimbal bearings leads to drift in readings obtained from such gyroscopes and consequent errors in navigation. A known method of eliminating such frictional losses has involved the use of nuclear magnetism in nuclear gyroscopes which do not require movement of parts.

Certain species of nuclei possess a net magnetic moment and are capable of exhibiting nuclear magnetic resonance (NMR). When a magnetic field is applied to these nuclei, the magnetic moments have a tendency to precess about the direction of the applied field with a characteristic frequency known as the Larmor frequency. The value of the Larmor frequency is proportional to the magnetic field. If the frame of reference containing the nuclear resonance apparatus were fixed in inertial space, the precessional frequency measured by an observer in that frame would be the Larmor frequency. If, however, the whole NMR apparatus were to experience a rotation about an axis parallel to the direction of the magnetic field, then the measured precessional frequency would be greater or smaller than the Larmor frequency the sense and magnitude being respectively proportional to the sense and magnitude of the rotation frequency.

Gyroscopes employing nuclear magnetic resonance are known but have suffered major disadvantages. Firstly due to non-uniformity of the available magnetic field, separate regions of the sample containing the nuclear magnetic moments see different values of the applied magnetic field and thus there is no unique resonant Larmor frequency. Also because of this, the spins loose coherence and the precession dies away rapidly. Secondly, it has proved difficult to screen the gyroscope from the effects of outside magnetic fields. In this latter respect mu metal shields have not proved entirely satisfactory.

It is an object of the present invention to provide a nuclear gyroscope in which these difficulties are substantially reduced.

The present invention comprises a cryogenic nuclear gyroscope comprising superconducting means to provide a substantially homogeneous magnetic field, a magnetic field sensitive substance having nuclei possessing a net magnetic moment, means to polarise the said substance to provide said net nuclear magnetic moment, detector means sensitive to the changes in magnetic flux caused by precession of the nuclear moments of said substance when in said homogeneous magnetic field and frequency sensitive means to detect changes in said precession caused by rotation of the gyroscope about an axis parallel to the direction of said homogeneous magnetic field. In one advantageous arrangement there is provided means to move the said substance between a first position within said polarising means and a second position within said homogeneous magnetic field.

The superconducting means preferably comprises an open-ended cylinder of circular cross-section, the said homogeneous magnetic field being formed within the bore thereof. Preferably the axial length of the cylinder is substantially greater than the dimensions of the magnetic field sensitive substance. By this means the substance can be placed in the axially central part of the cylinder bore where the magnetic field is most uniform. The cylinder is preferably made of niobium which can be machined to produce a cylinder of substantially uniform circularity. The polorising means may comprise a pair of electrical coils to produce a magnetic field outside of and adjacent to one end of the cylinder. The magnetic field sensitive substance is preferably helium-3 which can be made to have long magnetic relaxation times at cryogenic temperatures. The helium-3 can be contained within a spherical or a cylindrical cell preferably of pyrex. Advantageously the detector means comprises a SQUID magnetometer which may be linked to the helium-3 cell by means of a transformer.

Preferably the superconducting cylinder, polarising coils and SQUID magnetometer are enclosed within a superconducting shield, the shield and contents being located inside a liquid helium cryostat. There may be provided coil means to produce a magnetic field axially aligned with the cylinder whereby on cooling the cylinder below its critical temperature the substantially homogeneous magnetic field is trapped in the cylinder.

Preferably the means to move the said substance providing the net magnetic moment comprises a first support member attached at one end to the SQUID magnetometer and slidably mounted in a bearing through a wall of the superconducting shield and a second support member attached at one end to the cell containing the substance and at the other end to the SQUID magnetometer. Preferably also the SQUID magnetometer is a two-hole r.f. magnetometer which is linked to the sample by means of a transformer.

In order to increase the utility of the gyroscope there may be provided a second cell of the magnetic field sensitive substance supported such that it is movable between a position within said homogeneous magnetic field and a position within a polarising means, the arrangement being such that when either one cell is in use to detect said changes in precession the other is in position to be polarised. The second cell may be supported such that it is movable with the first cell, a further polarising means being located outside of and adjacent the end of the cylinder remote from the said polarising means.

In order to measure rotations about any axis there can be provided three such gyroscopes arranged such that their homogeneous magnetic fields are mutually perpendicular.

In order that the invention may be more fully understood, one embodiment thereof will now be described, by way of example only, with reference to the accompanying drawings, in which.

At normal temperatures a superconducting material has only a small magnetic susceptibility. However, when such a material sample is placed in an applied magnetic field and cooled below the critical temperature at which the material becomes superconducting almost all the lines of magnetic flux will be excluded from the sample which acts as a perfect diamagnet. If, however, the sample is formed as a cylinder some lines of flux can thread through the axial hole of the cylinder on cooling below the critical temperature. This magnetic flux in the cylinder can only have discrete or quantised magnitudes. On removing the applied field the magnetic flux in the cylinder remains trapped.

Figure 1:
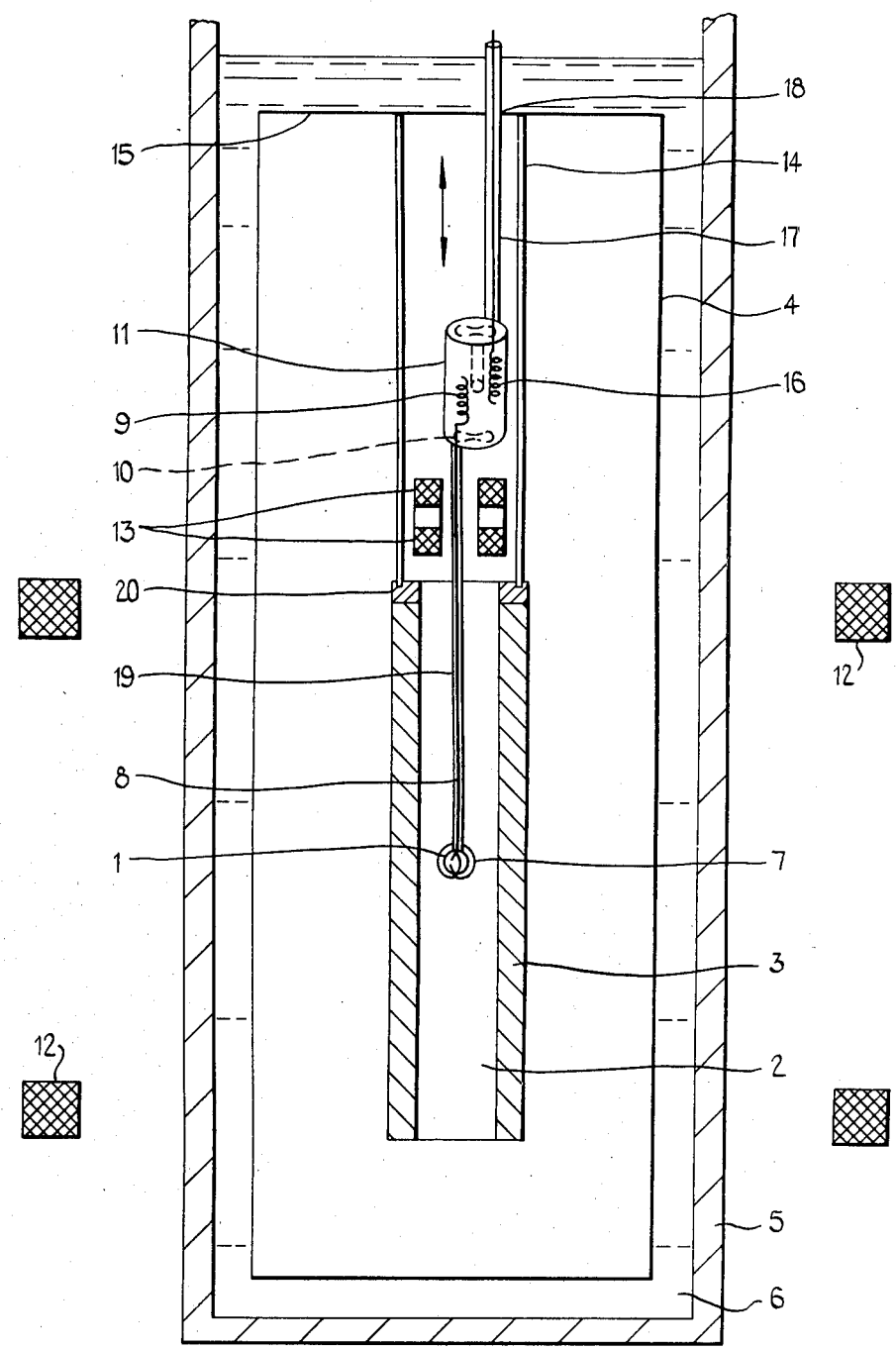
FIG. 1 is a schematic cross section diagram of a cryogenic nuclear gyroscope according to the invention.

In FIG. 1 is shown a cyrogenic nuclear gyroscope according to the invention wherein a helium-3 sample contained in a spherical pyrex cell 1 is supported centrally within the bore 2 of a cylinder 3 of superconducting niobium. The cell 1 can alternatively be cylindrical. Surrounding the niobium cylinder 3 is an evacuated cylindrical superconducting lead shield 4 closed at both ends, the purpose of which is to isolate the helium sample from external magnetic fields when at the operating temperature of the gyroscope. The shield 4 is immersed in a cryostat 5 containing liquid helium 6. Wound around the cell 1 containing the helium sample are a few turns of high conductivity copper tape comprising a primary coil 7 of a transformer 8. The axis of the coil 7 is arranged to be perpendicular to the axis of the superconducting cylinder 3. The secondary coil 9 of the flux transformer, located within one hole 10 of a two-hole r.f. Superconducting Quantum Interference Device (SQUID) 11, is connected to the primary pick-up coil 7 by twisted copper wires. As is well known in the art SQUIDS are a class of very sensitive magnetic flux sensors employing a superconducting loop into which a Josephson-like weak link or barrier has been built.

The coils 7 and 9 of the transformer are wound such that the voltage across the secondary coil 9 is greater than that across the primary thereby increasing the sensitivity of the SQUID. A pair of Helmholtz coils 12 is arranged coaxially around the cryostat 5 for producing a magnetic field B parallel to the axis of the superconducting tube 3. Arranged about the axis of the superconducting tube 3 and outside and adjacent to one end thereof is a pair of polarising coils 13 arranged to produce a magnetic field Bp perpendicular to B. The superconducting cylinder 3 is held by supports 14 dependent from either the upper end closure member 15 of the cylindrical shield as shown or from the lower end. The r.f. supply to the r.f. coil 16 of the SQUID 11 is fed through a first rigid cylindrical support member 17 slideably engaged in a bearing provided in a corresponding opening 18 in the closure member 15. The support member 17 is attached at its lower end to the SQUID 11. A similar second cylindrical rigid support member 19 dependent from the SQUID 11 supports the helium cell 1 with the leads connecting the pick-up coil 7 to the secondary coil 9 being fed therethrough. The dimensions of the support members 17 and 19 and the shield 4 are chosen such that by sliding the support member 19 through the bearing 18 the SQUID 11 and dependent helium cell 1 can be moved between a first upper position in which the helium cell 1 is positioned between the polarising coils 13 and a second lower position in which the helium cell is positioned centrally within the superconducting cylinder 3.

The gyroscope is set into operation by cooling the superconducting shield 4 and the superconducting cylinder 3 through their transition temperatures whilst subject to the magnetic field B generated by passing direct electric current through the coils 12. When the current to the coils is switched off, a small magnetic field Bo remains trapped in the superconducting cylinder 3 and also in the superconducting shield 4, the shield serving to isolate its contents from the effects of external magnetic fields. To ensure homogeneity of the field trapped in the superconducting cylinder 3 it has been found that the cylinder should be cooled slowly and uniformly from one end. To achieve this the shield 4 is evacuated and rods of relatively poor conductor brass are used for the supports 14 to conduct heat away to the surrounding liquid helium. The brass rods 14 are circumferentially arranged about an annular copper collar 20 attached to the upper end of the cylinder 3. The copper collar ensures uniformity of temperature at the end of the cylinder.

Surrounding the copper collar 20 is a heating coil (not shown). Liquid helium is first introduced into the outer cryostat 5 when the presence of exchange gases cause the niobium cylinder 3 to become superconducting at about the same time as the lead shield 4. The exchange gases are then removed by evacuation and the niobium cylinder 3 is heated above its transition temperature by the heating coil and then allowed to cool slowly by conduction from the upper end. The helium-3 cell 1 is placed in the first upper position between the polarising coils 13 by raising the supporting arm 17. Direct current is switched on to supply a strong polarising magnetic field Bp, several orders of magnitude greater than the field Bo trapped in the superconducting cylinder 3. When the resulting magnetisation of the helium-3 has been achieved the current through the polarising coils 13 is removed and the helium-3 cell lowered to its second position central of the bore of the superconducting cylinder 3. In this latter position the trapped field Bo due to the super-current in the cylinder 3 exerts a torque on the helium nuclei causing them to precess about the direction of the axial field Bo. This precession at the Larmor frequency induces a time dependent current in the primary pick-up coil 7 of the transformer 8, the secondary 9 of which is connected to the r.f. SQUID 11. The SQUID is coupled to a frequency measuring arrangement which will indicate the Larmor precessional frequency. The time required for the polarisation of the helium-3 to reach a maximum is determined experimentally by observing when the Squid magnetometer registers a maximum precessional signal.

The presently preferred arrangement employs an open sample cell 1 which is connected by means of a capillary tube to a helium-3 cylinder at two atmospheres. The cell 1 is thus filled in situ by condensation of the helium-3 within the cryostat. On raising or lowering of the cell 1 between the upper position within the polarising coils 13 and the lower position within the superconducting cylinder 3 the dependent capillary and gas bottle are also moved.

Figure 2:
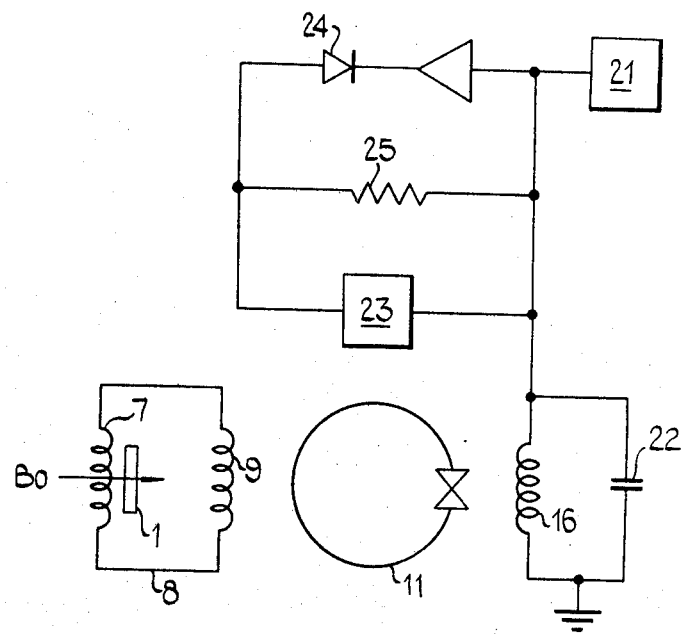
FIG. 2 is a schematic and block diagram of a circuit arrangement for use with the gyroscope of FIG. 1.

In FIG. 2 there is shown a schematic arrangement for measuring the Larmor frequency of the precessing helium nuclei. As a result of the precession within the helium cell 1 a current is induced in the transformer 8 which results in a time dependent magnetic flux linking the SQUID 11. The time dependent flux linking SQUID 11 modulates the r.f. voltage from the r.f. oscillator 21 appearing across a parallel resonant circuit 22 weakly coupled to the SQUID. The SQUID is operated in the 'flux-locked' mode wherein a low frequency current from the supply 23 is fed back into the r.f. coil 16 to compensate for the current induced therein by the time variation of the flux caused by the precessing helium nuclei.

Denoting the Larmor frequency by $W_L$, rotation of the gyroscope about an axis parallel to the direction of the magnetic field Bo, i.e. about the axis of the superconducting cylinder 3, at a frequency f causes the precessional frequency to change to ($W_L \pm f$) depending on the sense of the gyroscope rotation. A detector 24 is provided to monitor the frequency of the signal from the supply 23. The Larmor frequency can be measured by timing the zero crossings of the current through the resistor 25 in series with the detector 24. Changes in the measured frequency then correspond to the change in rotation rate of the gyroscope. The material for the cell 1 must be impermeable to the helium-3 and must be free from magnetic impurities. To increase the relaxation times of the helium-3 at cryogenic temperatures it is necessary to reduce the effects of collisions with the walls of the cell 1. By using a cryogenic coating on the walls of the cell 1 relaxation times can be extended, thereby permitting corresponding continuous use of the gyroscope. The cryogenic coating is formed by adding to the He-3 small amounts of hydrogen, deuterium or a rare gas which on cooling forms a solid coating on the cell walls.

The accuracy of the gyroscope depends upon the uniformity of the trapped magnetic field Bo about which the nuclear moments precess. This in turn depends upon the accuracy with which the circularity of the cylindrical superconducting cylinder 3 can be produced. The most critical region of the cylinder 3 is the central region within which the helium-3 sample is located. By boring and lapping a solid block of niobium a circular hole of 20 mm diameter can be produced to a tolerance of $0.2 \times 10^{-6}$ m over a 20 mm length. At any point on the axis, the departure from circularity would be an order of magnitude less than this. Alternatively the superconducting tube 3 may be made by evaporating on the inside surface of a precision quartz cylinder a layer of superconductor $100-1000 \times 10^{-9}$ m thick.

The superconducting shield 4 can be made of lead or niobium sheet cast into a cylinder or spot welded. Alternatively the shield could comprise a number of lead containers nested inside each other and separated by foam.

Figure 3:
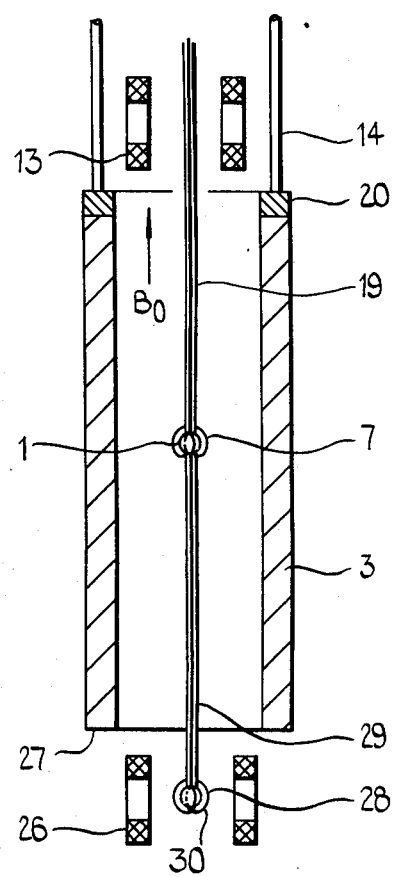
FIG. 3 is a schematic cross section of a modification of the cryogenic nuclear gyroscope.

In order to increase the utility of the gyroscope it is possible to modify the gyroscope so that there is no period when the gyroscope is out of service for the purpose of polarising the helium-3 sample. This can be achieved as shown in FIG. 3 by introducing a further pair of polarising coils 26 at the end 27 of the superconducting cylinder 3 remote from the SQUID 11 so that the two pairs of polarising coils are symmetrically disposed adjacent opposite ends of the cylinder. A second cell 28 containing a helium-3 sample is supported by a further support arm 29 such that when the helium-3 cell 1 is positioned centrally within the superconducting cylinder 3 the second cell 28 is located axially of the further pair of polarising coils 26. A second pick-up coil 30 is wound around the second cell 28. The pick-up coils 7 and 30 are connected to a switch (not shown) arranged such that when a cell is located inside the cylinder 3 the pick-up coil is connected to the SQUID magnetometer otherwise the pick-up coil is open circuit. By this means one polarised helium-3 cell may be utilised within the field Bo as a gyroscope while the second helium-3 cell may be re-polarised in the field Bp of the further pair of polarising coils. As required the SQUID and attached helium-3 cells may be raised to the first upper position whereby the newly polarised helium-3 may replace the first helium-3 cell.

Instead of the two sample arrangement it may be possible to employ one of the well known continuous wave resonance techniques to a single sample. The polarising coils 13 may alternatively be situated inside the cavity of the niobium cylinder 3 and around the He³ sample cell 1 and pick-up coil arrangement 7. This arrangement can be used for both the CW and DC cases.

The Helmholz coils 12 used to provide the trapped field Bo may alternatively be located inside the cryostat. It is also envisaged that where a higher polarisation of the helium-3 sample is required, optical pumping may be used to achieve this. Other forms of SQUID detection of the precessional frequency are possible, the invention in no way being limited to the two hole r.f. SQUID described.

As described above, the gyroscope and frequency measuring apparatus serve to determine rotations about one axis. For navigational use in ships or in aircraft additional separate systems will be required to give rotational information about mutually perpendicular axes.

I claim:

1. A cryogenic nuclear gyroscope comprising superconducting means to provide a substantially homogeneous magnetic field, a magnetic field sensitive substance having nuclei possessing a net magnetic moment, means to polarise the said substance to provide said net nuclear magnetic moment, detector means sensitive to the changes in magnetic flux caused by precession of the nuclear moments of said substance when in said homogeneous magnetic field and frequency sensitive means to detect changes in said precession caused by rotation of the gyroscope about an axis parallel to the direction of said homogeneous magnetic field.

2. A cryogenic nuclear gyroscope as claim 1 wherein the superconducting means comprises an open-ended cylinder of circular cross-section, the said homogeneous magnetic field being formed within the bore thereof.

3. A cryogenic nuclear gyroscope as claimed in claim 2 wherein the cylinder is made of niobium.

4. A cryogenic nuclear gyroscope as claimed in claim 3 wherein the magnetic field sensitive substance is helium-3.

5. A cryogenic nuclear gyroscope as claimed in claim 4 wherein the helium-3 is contained within a spherical pyrex cell.

6. A cryogenic nuclear gyroscope as claimed in claim 5 wherein the detector means comprises a SQUID magnetometer linked to the magnetic field sensitive substance by means of a transformer.

7. A cryogenic nuclear gyroscope as claimed in claim 6 wherein the superconducting cylinder, polarising means and detector means are enclosed within a superconducting shield, the shield and contents being located inside a liquid helium cryostat.

8. A cryogenic nuclear gyroscope as claimed in claim 7 wherein there is provided coil means to produce a magnetic field axially aligned with the cylinder whereby on cooling the cylinder below its critical temperature the substantially homogeneous magnetic field is trapped in the cylinder.

9. A cryogenic nuclear gyroscope as claimed in claim 8 comprising means to move the said substance between a first position within said polarising means and a second position within said homogeneous magnetic field.

10. A cryogenic nuclear gyroscope as claimed in claim 9 wherein there is provided a second magnetic field sensitive substance supported such that it is movable between a position within said homogeneous magnetic field and a position within a polarising means, the arrangement being such that when either one substance is in use to detect said changes in precession the other is in position to be polarised.

11. A cryogenic nuclear gyroscope as claimed in claim 10 wherein the second substance is supported such that it is movable with the first substance, a further polarising means being located outside of and adjacent the end of the cylinder remote from the first said polarising means.

12. A cryogenic nuclear gyroscope as claimed in claim 8 wherein the polarising means comprises an electrical coil located within the substantially homogeneous magnetic field.

13. A cryogenic nuclear gyroscope as claimed in claim 2 wherein the magnetic field sensitive substance is helium-3.

14. A cryogenic nuclear gyroscope as claimed in claim 13 wherein the helium-3 is contained within a spherical pyrex cell.

15. A cryogenic nuclear gyroscope as claimed in claim 14 wherein the detector means comprises a SQUID magnetometer linked to the magnetic field sensitive substance by means of a transformer.

16. A cryogenic nuclear gyroscope as claimed in claim 15 wherein the superconducting cylinder, polarising means and detector means are enclosed within a superconducting shield, the shield and contents being located inside a liquid helium cryostat.

17. A cryogenic nuclear gyroscope as claimed in claim 16 wherein there is provided coil means to produce a magnetic field axially aligned with the cylinder whereby on cooling the cylinder below its critical temperature the substantially homogeneous magnetic field is trapped in the cylinder.

18. A cryogenic nuclear gyroscope as claimed in claim 17 comprising means to move the said substance between a first position within said polarising means and a second position within said homogeneous magnetic field.

19. A cryogenic nuclear gyroscope as claimed in claim 18 wherein there is provided a second magnetic field sensitive substance supported such that it is movable between a position within said homogeneous magnetic field and a position within a polarising means, the arrangement being such that when either one substance is in use to detect said changes in precession the other is in position to be polarised.

20. A cryogenic nuclear gyroscope as claimed in claim 19 wherein the second substance is supported such that it is movable with the first substance, a further polarising means being located outside of and adjacent the end of the cylinder remote from the first said polarising means.

21. A cryogenic nuclear gyroscope as claimed in claim 17 wherein the polarising means comprises an electrical coil located within the substantially homogeneous magnetic field.

22. A cryogenic nuclear gyroscope as claimed in claim 13 wherein the detector means comprises a SQUID magnetometer linked to the magnetic field sensitive substance by means of a transformer.

23. A cryogenic nuclear gyroscope as claimed in claim 22 wherein the superconducting cylinder, polarising means and detector means are enclosed within a superconducting shield, the shield and contents being located inside a liquid helium cryostat.

24. A cryogenic nuclear gyroscope as claimed in claim 23 wherein there is provided coil means to produce a magnetic field axially aligned with the cylinder whereby on cooling the cylinder below its critical temperature the substantially homogeneous magnetic field is trapped in the cylinder.

25. A cryogenic nuclear gyroscope as claimed in claim 24 comprising means to move the said substance between a first position within said polarising means and a second position within said homogeneous magnetic field.

26. A cryogenic nuclear gyroscope as claimed in claim 25 wherein there is provided a second magnetic field sensitive substance supported such that it is movable between a position within said homogeneous magnetic field and a position within a polarising means, the arrangement being such that when either one substance is in use to detect said changes in precession the other is in position to be polarised.

27. A cryogenic nuclear gyroscope as claimed in claim 26 wherein the second substance is supported such that it is movable with the first substance, a further polarising means being located outside of and adjacent the end of the cylinder remote from the first said polarising means.

28. A cryogenic nuclear gyroscope as claimed in claim 24 wherein the polarising means comprises an electrical coil located within the substantially homogeneous magnetic field.

29. A cryogenic nuclear gyroscope as claimed in claim 4 wherein the detector means comprises a SQUID magnetometer linked to the magnetic field sensitive substance by means of a transformer.

30. A cryogenic nuclear gyroscope as claimed in claim 29 wherein the superconducting cylinder, polarising means and detector means are enclosed within a superconducting shield, the shield and contents being located inside a liquid helium cryostat.

31. A cryogenic nuclear gyroscope as claimed in claim 30 wherein there is provided coil means to produce a magnetic field axially aligned with the cylinder whereby on cooling the cylinder below its critical temperature the substantially homogeneous magnetic field is trapped in the cylinder.

32. A cryogenic nuclear gyroscope as claimed in claim 31 comprising means to move the said substance between a first position within said polarising means and a second position within said homogeneous magnetic field.

33. A cryogenic nuclear gyroscope as claimed in claim 32 wherein there is provided a second magnetic field sensitive substance supported such that it is movable between a position within said homogeneous magnetic field and a position within a polarising means, the arrangement being such that when either one substance is in use to detect said changes in precession the other is in position to be polarised.

34. A cryogenic nuclear gyroscope as claimed in claim 33 wherein the second substance is supported such that it is movable with the first substance, a further polarising means being located outside of and adjacent the end of the cylinder remote from the first said polarising means.

35. A cryogenic nuclear gyroscope as claimed in claim 31 wherein the polarising means comprises an electrical coil located within the substantially homogeneous magnetic field.

* * * * *